United States Patent
Chang et al.

(10) Patent No.: US 11,526,328 B2
(45) Date of Patent: Dec. 13, 2022

(54) COMPUTATION METHOD AND APPARATUS EXPLOITING WEIGHT SPARSITY

(71) Applicant: MACRONIX International Co., Ltd., Hsinchu (TW)

(72) Inventors: Hung-Sheng Chang, Taipei (TW); Han-Wen Hu, Tainan (TW); Hsiang-Pang Li, Hsinchu County (TW); Tzu-Hsien Yang, Taoyuan (TW); I-Ching Tseng, New Taipei (TW); Hsiang-Yun Cheng, Taoyuan (TW); Chia-Lin Yang, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 383 days.

(21) Appl. No.: 16/781,868

(22) Filed: Feb. 4, 2020

(65) Prior Publication Data
US 2021/0240443 A1    Aug. 5, 2021

(51) Int. Cl.
*G06F 7/544* (2006.01)
*G06N 3/04* (2006.01)
*G11C 13/00* (2006.01)

(52) U.S. Cl.
CPC .............. *G06F 7/5443* (2013.01); *G06N 3/04* (2013.01); *G11C 13/004* (2013.01)

(58) Field of Classification Search
CPC ........................... G06F 7/5443; G11C 13/004
See application file for complete search history.

(56) References Cited

U.S. PATENT DOCUMENTS

| | | | |
|---|---|---|---|
| 2018/0075339 A1* | 3/2018 | Ma | G06F 7/026 |
| 2020/0035305 A1* | 1/2020 | Choi | G11C 11/54 |
| 2021/0192325 A1* | 6/2021 | Hoang | G11C 13/0028 |

FOREIGN PATENT DOCUMENTS

WO    WO-2020069239 A1 *    4/2020    ............... G06F 5/06

* cited by examiner

*Primary Examiner* — Michael D. Yaary
(74) *Attorney, Agent, or Firm* — J.C. Patents

(57) ABSTRACT

A computation method and a computation apparatus exploiting weight sparsity, adapted for a processor to perform multiply-and-accumulate operations on a memory including multiple input and output lines crossing each other. In the method, weights are mapped to the cells of each operation unit (OU) in the memory. The rows of the cells of each OU are compressed by removing at least one row of the cells each mapped with a weight of 0, and an index including values each indicating a distance between every two rows of the cells including at least one cell mapped with a non-zero weight for each OU is encoded. Inputs are inputted to the input lines corresponding to the rows of each OU excluding the rows of the cells with the weight of 0 according to the index and outputs are sensed from the output lines corresponding to the OU to compute a computation result.

18 Claims, 9 Drawing Sheets

COMPUTATION METHOD AND APPARATUS EXPLOITING WEIGHT SPARSITY

BACKGROUND

Field of the Disclosure

The present disclosure relates to a computation method and a computation apparatus, and more particularly to a computation method and a computation apparatus exploiting weight sparsity.

Description of Related Art

Deep neural networks (DNNs) have shown its capability to achieve higher accuracy on several fields such as image classification, object detection, and speech recognition. Modern DNN models involve thousands to millions of computation operations per input activation. As a size of the DNN models increases, several challenges have emerged on performing DNN operations over the current Von-Neumann architecture.

The crossbar accelerators with resistive random-access memory (ReRAM) are one of the most intensively-studied solutions to meet the performance and energy efficiency challenges for DNN operations. The ReRAM, one of emerging non-volatile memories (NVMs), memorizing data by changing the resistance of cells is proved to possess both capabilities of computing and memorizing. Specifically, crossbar accelerators perform digital DNN operations, i.e., multiply-and-accumulate (MAC) operations, on the analog aspect by setting different input voltages and resistance values to represent input and weight values, respectively.

For example, FIG. 1A and FIG. 1B show an example of performing MAC operations by using a crossbar accelerator. Referring to FIG. 1A, a sum of dot product on input features (X1, X2) and weights (W1, W2) in a perceptron, which is a basic operation to classify objects, is implemented by a crossbar accelerator 10 with ReRAM structure. In the crossbar accelerator 10, each of the wordlines WL0~WL2 is connected to a bitline BL by a ReRAM cell (represented with corresponding conductances G1, G2, G3) at the cross point. Given input voltages V1 to V3, generated from input features X1 and X2 and a bias, to the corresponding wordlines WL0~WL2, the emerged electric currents I1, I2, I3 of each ReRAM cell induced by conductance G1, G2, G3 are accumulated to a total current I on the bitline BL instantaneously. The results of the MAC operations are retrieved simultaneously by sense amplifier (not shown) connected to the bitline BL, where the value of I equals to X1×W1+X2×W2+Bias.

With the computing-in-memory capability, the ReRAM-based DNN accelerators can reduce data movement and provide significant energy savings.

It is noted that common DNNs have significant redundancy in filter weights and weight sparsity may be further used to improve energy efficiency. However, due to the tightly coupled crossbar structure, it is difficult to exploit sparsity efficiently in ReRAM-based DNN accelerators.

SUMMARY

In view of the above, the present disclosure provides a computation method and a computation apparatus exploiting weight sparsity capable of eliminating ineffectual computation, and significantly improving computation performance.

The present disclosure provides a computation method exploiting weight sparsity, adapted for a processor to perform multiply-and-accumulate (MAC) operations on a memory having a crossbar architecture. The memory comprises a plurality of input lines and a plurality of output lines crossing each other, a plurality of cells respectively disposed at intersections of the input lines and the output lines, and a plurality of sense amplifiers respectively connected to the output lines. In the method, a plurality of weights are mapped to the cells of each of a plurality of operation units (OUs) in the memory. The rows of the cells of each OU are compressed by removing at least one row of the cells each mapped with a weight of 0, and an index including values each indicating a distance between every two rows of the cells including at least one cell mapped with a non-zero weight for each OU is encoded. A plurality of inputs are inputted to the input lines corresponding to the rows of each OU excluding the rows of the cells with the weight of 0 according to the index and a plurality of multiply-and-accumulate results are sensed from the output lines by the sense amplifiers corresponding to the OU to compute a computation result.

In an embodiment of the disclosure, the step of inputting a plurality of inputs to the input lines corresponding to the rows of each OU excluding the rows of the cells with the weight of 0 according to the index comprises decoding the index to obtain the values indicating the distances, and fetching the inputs to be inputted to the rows of the cells separated by the values and inputting the inputs into the corresponding input lines.

In an embodiment of the disclosure, the step of inputting the inputs into the corresponding input lines comprises checking values of the inputs to be inputted, and skipping the inputs with a value of 0 and inputting the inputs other than the skipped inputs into the corresponding input lines.

In an embodiment of the disclosure, the step of inputting the inputs into the corresponding input lines comprises rearranging a computation order of the inputs according to a number of rows of each OU.

In an embodiment of the disclosure, the step of sensing a plurality of outputs from the output lines by the sense amplifiers corresponding to the OU to compute a computation result comprises sensing the multiply-and-accumulate results, weighting the sensed multiply-and-accumulate results with corresponding exponential bases and summing weighted results to obtain the computation result.

The present disclosure provides a computation apparatus exploiting weight sparsity comprises a memory and a processor. The memory has a crossbar architecture and comprises a plurality of input lines and a plurality of output lines crossing each other, a plurality of cells respectively disposed at intersections of the input lines and the output lines, and a plurality of sense amplifiers respectively connected to the output lines. The processor is coupled to the memory and configured to perform MAC operations comprising steps of: mapping a plurality of weights to the cells of each of a plurality of OUs in the memory; compressing the rows of the cells of each OU by removing at least one row of the cells each mapped with a weight of 0, and encoding an index including values each indicating a distance between every two rows of the cells including at least one cell mapped with a non-zero weight for each OU, and inputting a plurality of inputs to the input lines corresponding to the rows of each OU excluding the rows of the cells with the weight of 0 according to the index and sensing a plurality of multiplyand-accumulate results from the output lines by the sense amplifiers corresponding to the OU to compute a computation result.

In an embodiment of the disclosure, the processor decodes the index to obtain the values indicating the distances, fetches the inputs to be inputted to the rows of the cells separated by the values and inputs the inputs into the corresponding input lines.

In an embodiment of the disclosure, the processor checks values of the inputs to be inputted, skips the inputs with a value of 0, and inputs the remaining inputs into the corresponding input lines.

In an embodiment of the disclosure, the processor rearranges a computation order of the inputs according to a number of rows of each OU.

In an embodiment of the disclosure, each OU comprises the cells disposed at intersections of at least two of the input lines and at least two of the output lines, and the corresponding sense amplifiers connected to the output lines.

In an embodiment of the disclosure, the memory further comprises a digital-to-analog converter (DAC) to convert an input data into a plurality of input voltages serving as the inputs.

In an embodiment of the disclosure, the memory comprises NAND flash, NOR flash, phase change memory (PCM), spin-transfer torque random-access memory (STT-RAM), resistive random-access memory (ReRAM), magnetoresistive random-access memory (MRAM), ferroelectric random-access memory (FRAM), static random-access memory (SRAM), or dynamic random-access memory (DRAM).

In an embodiment of the disclosure, the input lines are wordlines of the memory and the output lines are bitlines of the memory, or the input lines are bitlines of the memory and the output lines are wordlines of the memory.

In order to make the aforementioned features and advantages of the disclosure more comprehensible, embodiments accompanying figures are described in detail below.

DESCRIPTION OF EMBODIMENTS

In a ReRAM crossbar architecture, weights stored in the same wordline are multiplied by the same input, and currents flowing through the same bitline contribute to the same output. Sparsity may be exploited when the wordline or bitline cells contain zeros. Similarly, the sparsity of input feature maps can be leveraged when the inputs to the crossbar array are all zeros in the same cycle. Accordingly, a computation method has been proposed to exploit weight sparsity. Weight compression can be done at the operation unit (OU) level in either the row or column dimension, and input indexing is adopted to fetch correct inputs for the compressed weights. Such sparsity in weights provides great potential for various layers or applications in DNN models such as fully connection layer, convolution layer, multiple layer perception or support vector machine, or other computation models requiring a large amount of multiply-and-accumulate (MAC) operations such as memory data search, graph handing or voice detection, so as to achieve better performance and energy efficiency.

Figure 1A:
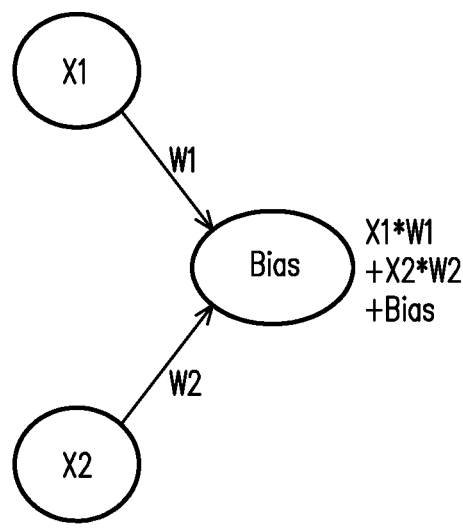
FIG. 1A and FIG. 1B show an example of performing MAC operations by using a crossbar accelerator.
Figure 1B:
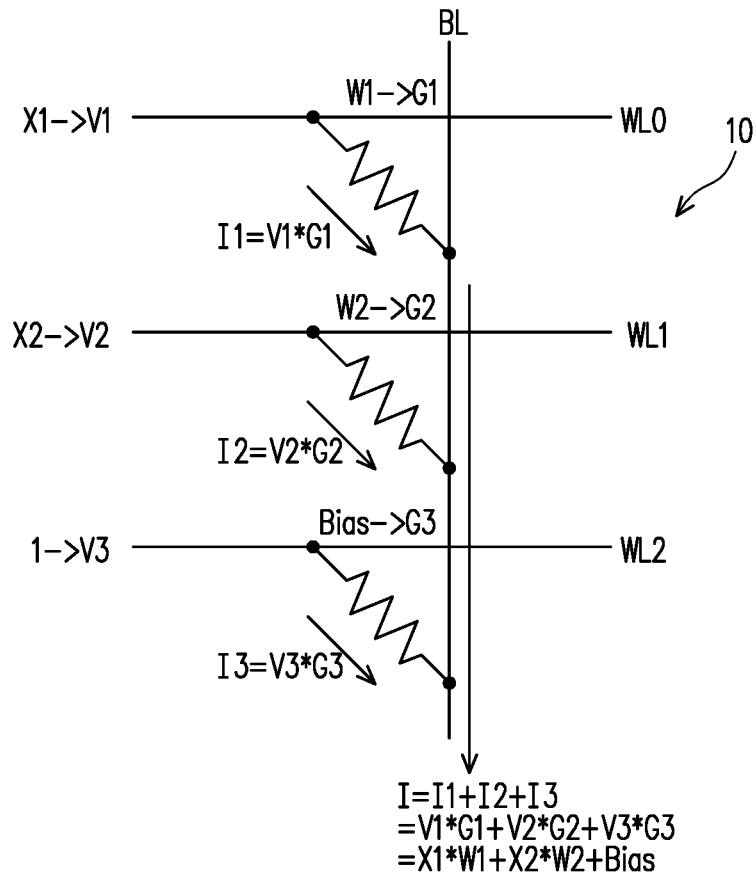
Figure 2:
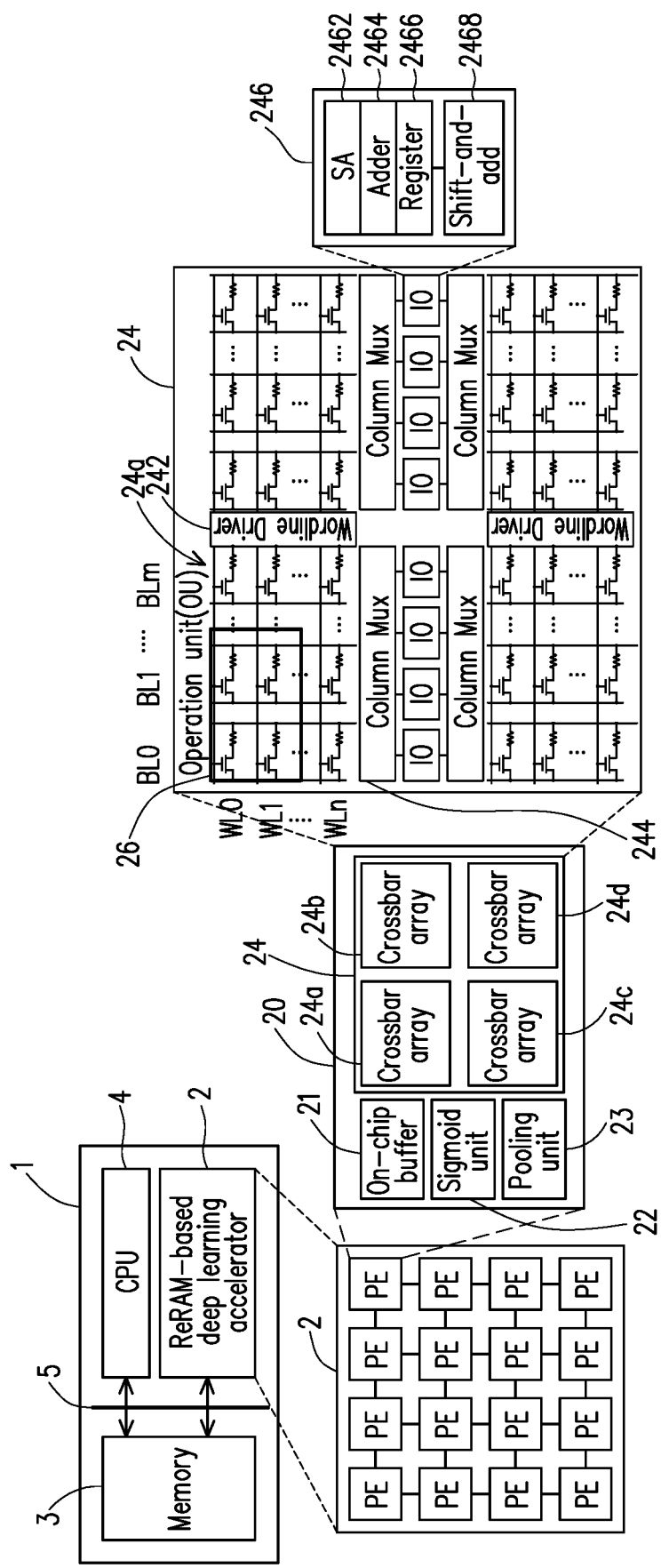
FIG. 2 is a schematic diagram illustrating the architecture of a ReRAM-based DNN accelerator according to an embodiment of the application.

FIG. 2 is a schematic diagram illustrating the architecture of a ReRAM-based DNN accelerator according to an embodiment of the application. Referring to FIG. 2, a computing device 1 includes a ReRAM-based DNN accelerator 2, a memory 3, a CPU 4, which are disposed on a chip and communicated with each other through a bus 5. The accelerator 2 is configured to assist the CPU 4 in performing DNN operations and includes multiple processing engines (PEs) 20 connected with on-chip interconnects. Each PE 20 includes, for example, an on-chip buffer 21 for temporarily storing inputs and outputs (e.g. input and output feature maps), a sigmoid unit 22 and a polling unit 23 for supporting the non-linear function and pooling layer in a neural network, and a computation unit (CU) 24. The CU 24 includes crossbar arrays 24a to 24d, which are responsible for the acceleration of multiplications in convolution and fully-connected layers.

In each crossbar array (e.g. crossbar array 24a), filter weights are stored as the conductances of ReRAM cells through bitlines BL0 to BLm and a wordline driver (WLD) 242 such as a digital-to-analog converter (DAC) or an inverter is connected to each of the wordlines WL0 to WLn of the crossbar array 24a to convert an input data (e.g. input feature maps) into input voltages. The accumulated currents (sum-of-products results) on the bitlines BL0 to BLm passing through the column multiplexer (Mux) 244 are sensed by the sense amplifiers (SAs) 2462 in the IOs 246 connected to the column multiplexer 244. The sensed currents are added by the adder 2464, stored in the register 2466 and converted into a computation result through shifting and adding performed by the shift-and-add circuit 2468. Operation units (OUs) with a predetermined size (e.g. OU 26) are applied to perform OU computation. That is, by storing filter weights in the ReRAM cells of the OU and inputting input voltages to the corresponding wordlines (e.g. wordlines WL0 and WL1), the multiply-and-accumulate results (outputs) can be obtained by reading out the accumulated currents on the corresponding bitlines (e.g. bitlines BL0 and BL1).

Figure 3:
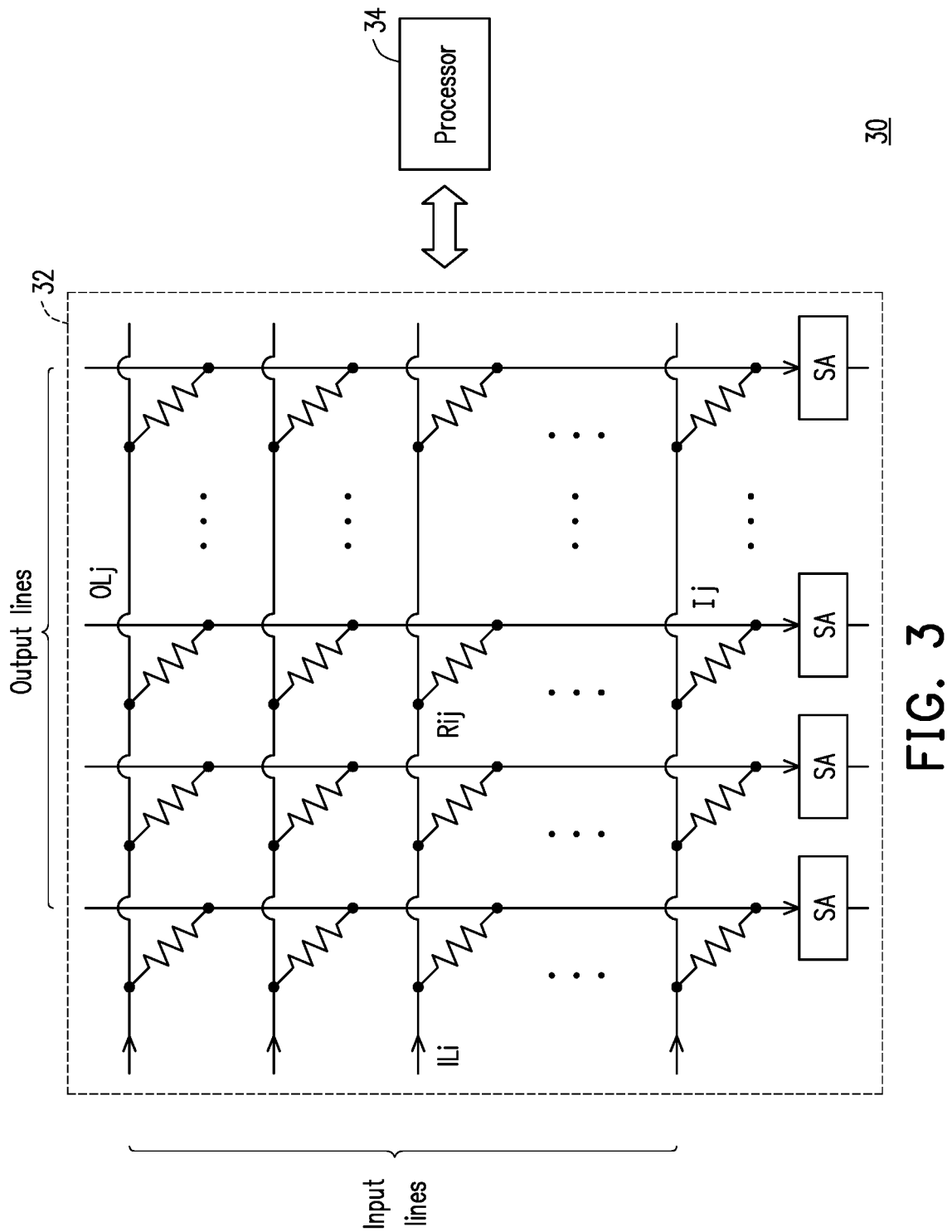
FIG. 3 is a schematic diagram of a computation apparatus exploiting weight sparsity according to an embodiment of the disclosure.

FIG. 3 is a schematic diagram of a computation apparatus exploiting weight sparsity according to an embodiment of the disclosure. Referring to FIG. 3, the computation apparatus 30 of the embodiment is, for example, a crossbar accelerator for neural network computation, and is configured to realize process-in-memory (PIM). The neural network computation apparatus 30 comprises a memory 32 and a processor 34.

The memory 32 is, for example, NAND flash, NOR flash, phase change memory (PCM), spin-transfer torque random-access memory (STT-RAM), resistive random-access memory (ReRAM), magnetoresistive random-access memory (MRAM), ferroelectric random-access memory (FRAM), static random-access memory (SRAM), or dynamic random-access memory (DRAM), which is not limited herein. The memory 32 comprises a plurality of input lines $IL_i$ and a plurality of output lines $OL_j$ crossing each other, a plurality of cells (represented by its resistance $R_{ij}$) respectively disposed at intersections of the input lines $IL_i$ and the output lines $OL_3$, and a plurality of sense amplifiers SA respectively connected to the output lines $OL_j$. In some embodiments, the input lines $IL_i$ are wordlines while the output lines $OL_j$ are bitlines, and in some embodiments, the input lines $IL_i$ are bitlines while the output lines $OL_j$ are wordlines, which is not limited herein.

The processor 34 is, for example, a central processing unit (CPU), or other programmable general-purpose or specific-purpose microprocessor, microcontroller (MCU), programmable controller, application specific integrated circuits (ASIC), programmable logic device (PLD) or other similar devices or a combination of these devices; the embodiment provides no limitation thereto. In the present embodiment, the processor 34 is configured to execute instructions for performing the computation method as described below.

Figure 4:
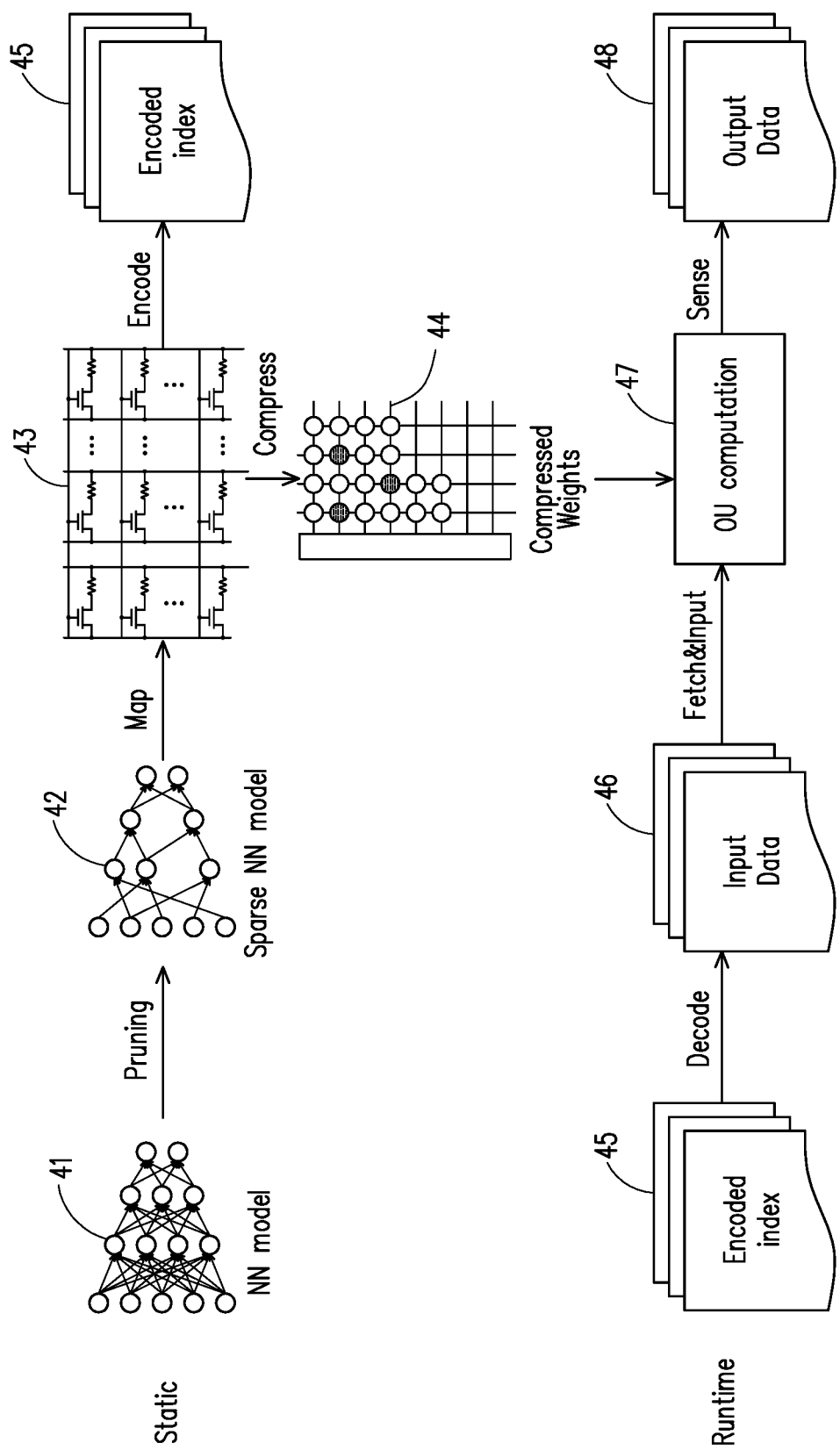
FIG. 4 is a schematic diagram illustrating a computation method exploiting weight sparsity according to an embodiment of the disclosure.

FIG. 4 is a schematic diagram illustrating a computation method exploiting weight sparsity according to an embodiment of the disclosure. Referring to FIG. 4, the computation method of the embodiment can be divided into a static stage and a runtime stage.

At the static stage, a neural network (NN) model 41 is first provided or established and a pruning algorithm is executed to regularize the distribution of zero weights in the NN model 41 so as to obtain a sparse NN model 42. The weights in the sparse NN model 42 are then mapped to the cells of the operation units (OUs) 43 in the memory. In one embodiment, each OU may include, for example, cells disposed at intersections of at least two input lines and at least two output lines, and the corresponding sense amplifiers connected to the output lines. The rows of the cells of the OUs 43 are compressed by removing at least one row of the cells each mapped with a weight of 0 to obtain compressed OUs 44 with compressed weights and values each indicating a distance between every two rows of the cells including at least one cell mapped with a non-zero weight for the OUs 43 are encoded to obtain an encoded index 45.

At the runtime stage, the encoded index 45 is retrieved and decoded to the values indicating the distances. The input data 46 is fetched and the inputs to be inputted to the rows of the cells separated by the values in the input data 46 are further fetched and inputted into the corresponding input lines of the compressed OUs 44 so as to perform OU computation 47. The outputs from the output lines of the compressed OUs 44 are sensed by sense amplifiers and used to compute an output data 48.

In the embodiment described above, removal of cells with zero weight in the row direction is adopted for weight compression so as to eliminate zero row vectors and save input line resources.

Figure 5:
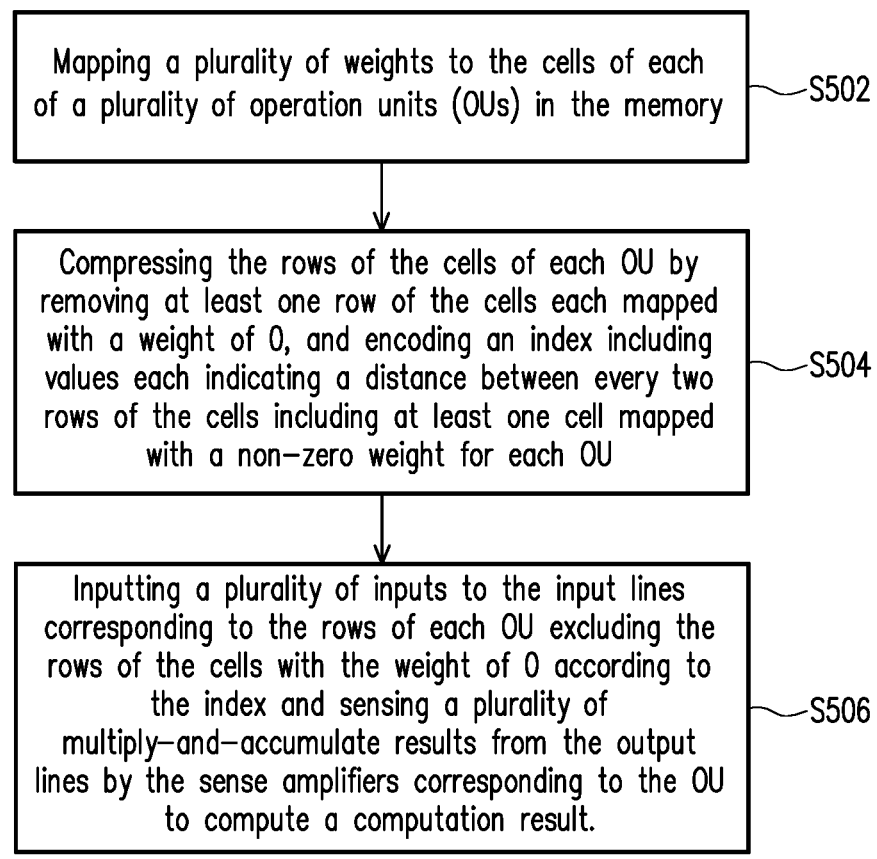
FIG. 5 is a flow chart of computation method exploiting weight sparsity according to an embodiment of the disclosure.

In detail, FIG. 5 is a flow chart of computation method exploiting weight sparsity according to an embodiment of the disclosure. Referring to FIG. 3 and FIG. 5, the method of the present embodiment is adaptable for the above-mentioned computation apparatus 30, and the detailed steps of the computation method of the present embodiment will be described below with reference to the various devices and components of the computation apparatus 30.

First, in step S502, the processor 34 maps a plurality of weights to the cells of each of a plurality of operation units (OUs) in the memory. In one embodiment, the weights of each filter are mapped to the cells of one output line. It is noted, in the ReRAM-based DNN accelerator, all the input lines in the crossbar array can be activated concurrently in a single cycle. At every cycle, an input vector of an input feature map is converted into input voltages via the WLD and fed into the crossbar array, and a next input vector of the input feature map is fed into the crossbar array in a next cycle. Due to the limited WLD resolution and ReRAM cell density, the input vectors of the input feature map are decomposed and fed into the input lines of the crossbar array using multiple clock cycles, and the weights of each filter are also decomposed and mapped onto different output lines of the crossbar array.

In step S504, the processor 34 compresses the rows of the cells of each OU by removing at least one row of the cells each mapped with a weight of 0, and encodes an index including values each indicating a distance between every two rows of the cells including at least one cell mapped with a non-zero weight for each OU.

In step S506, the processor 34 inputs a plurality of inputs to the input lines corresponding to the rows of each OU excluding the rows of the cells with the weight of 0 according to the index and senses a plurality of multiply-and-accumulate results from the output lines by the sense amplifiers corresponding to the OU to compute a computation result.

In detail, the processor 34 decodes the index to obtain the values indicating the distances, and then fetches the inputs to be inputted to the rows of the cells separated by the values and inputs the fetched inputs into the corresponding input lines for performing the OU computation. The multiply-and-accumulate results sensed by the sense amplifiers from the output lines are weighted with its corresponding exponential bases and the weighted results summed to obtain a final computation result.

It is noted that, in one embodiment, before inputting the inputs, the processor 34 may check the values of the inputs to be inputted, and skips the inputs with a value of 0 and inputs the inputs other than the skipped inputs into the corresponding input lines. Since the OU computations for the inputs with a value of 0 are skipped, activation sparsity and weight sparsity can be jointly exploited to further enhance the computation performance and energy saving.

Figure 6A:
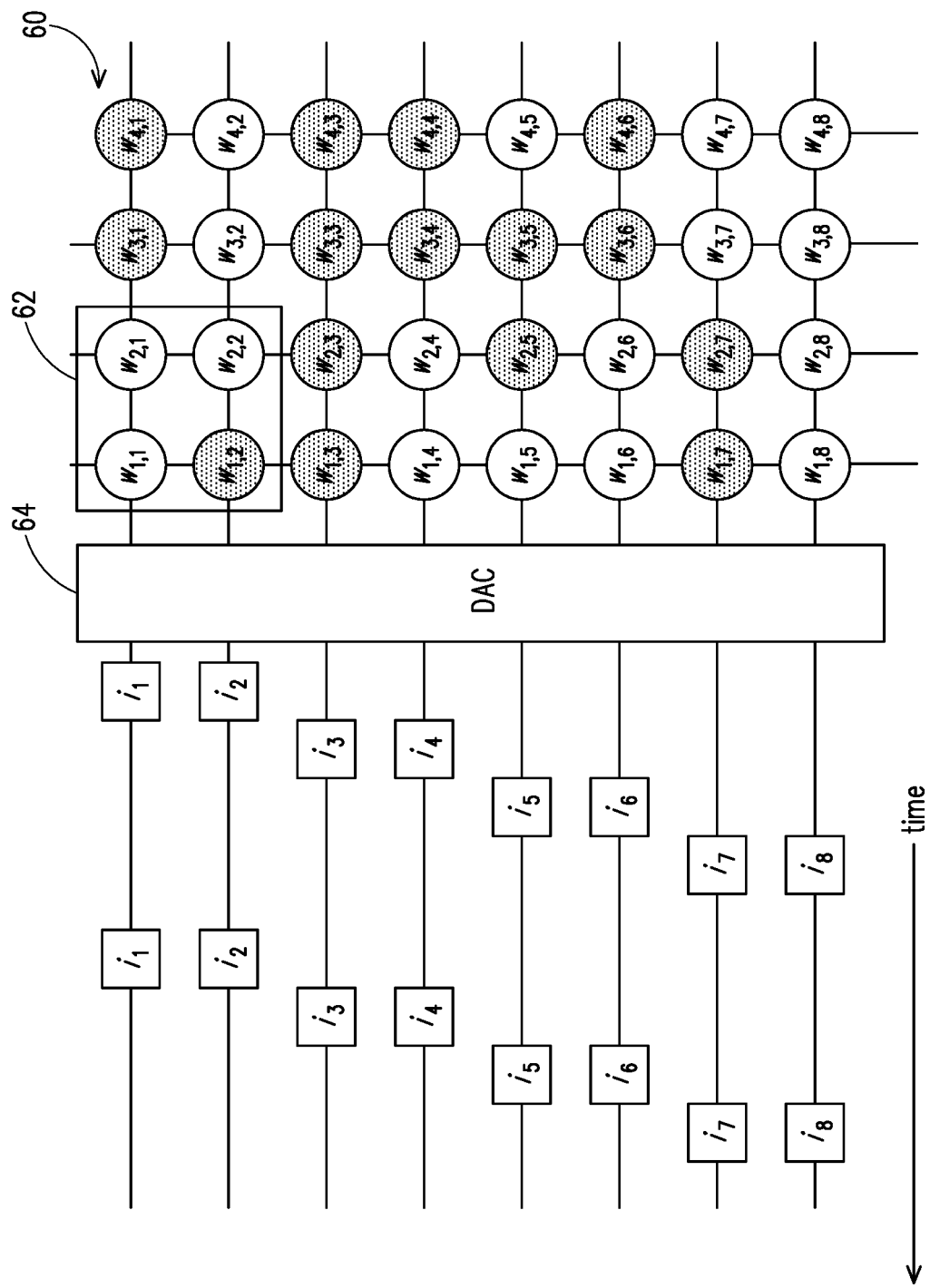
FIG. 6A to FIG. 6C are schematic diagrams illustrating weight compression according to an embodiment of the application.
Figure 6B:
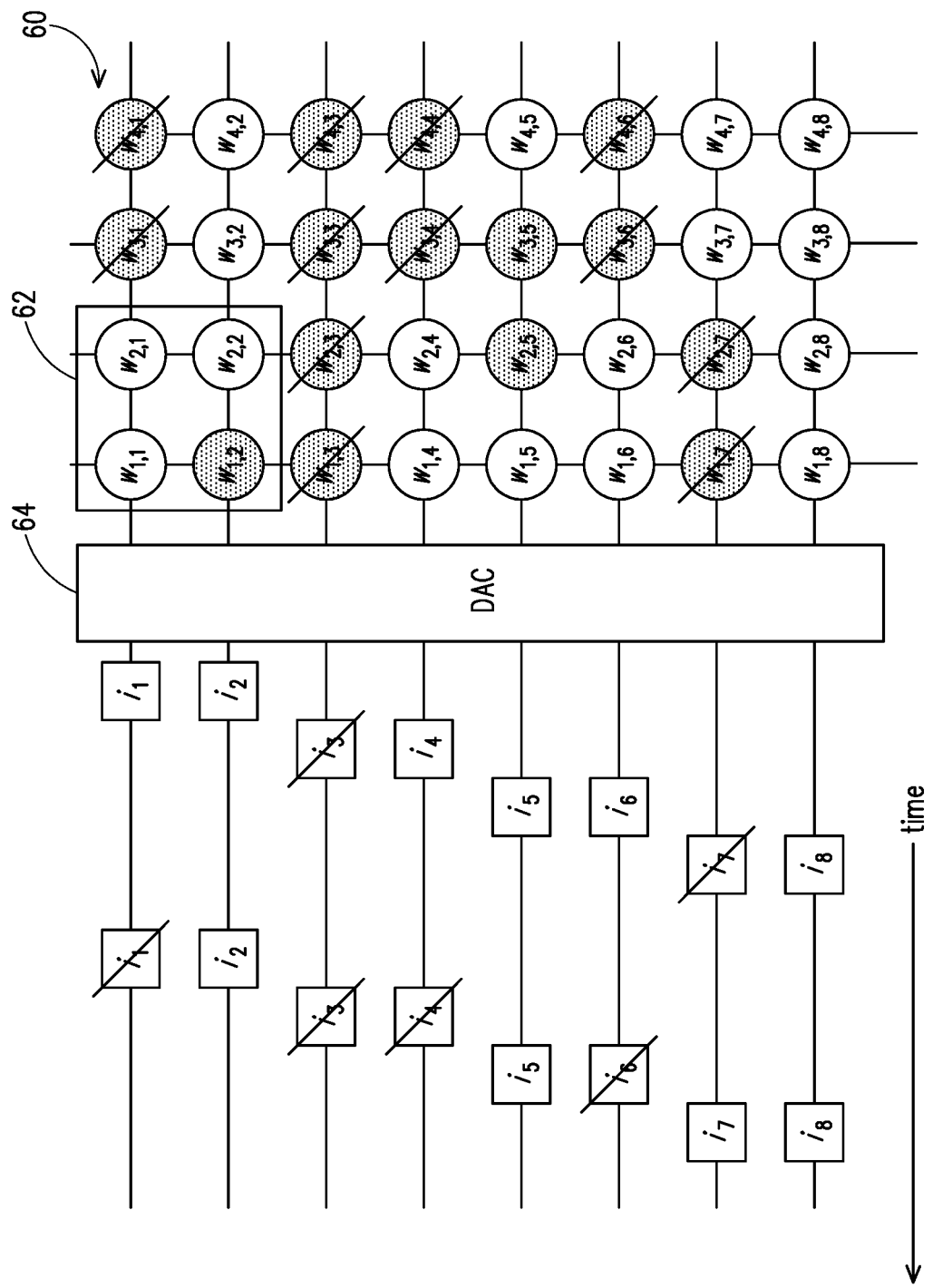
Figure 6C:
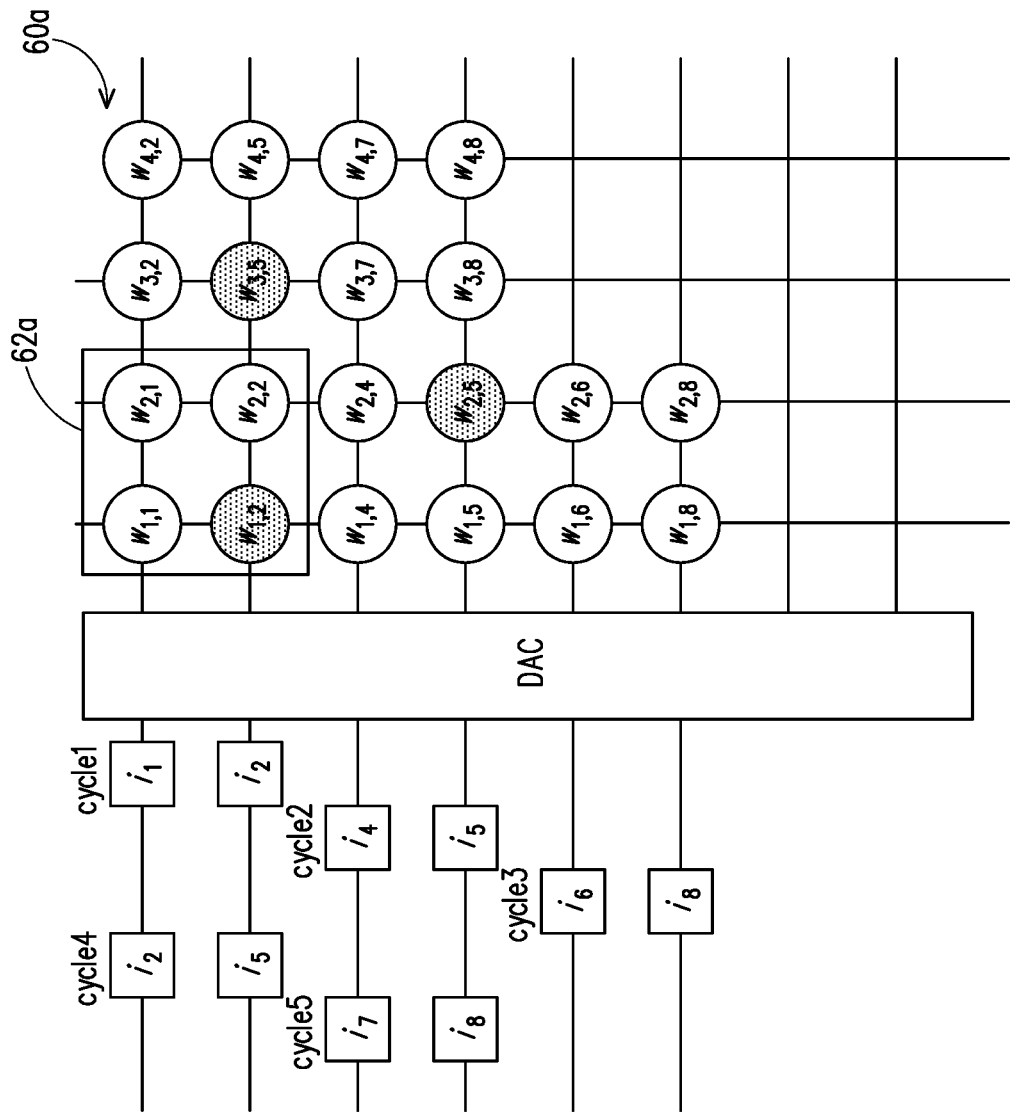

For example, FIG. 6A to FIG. 6C are schematic diagrams illustrating weight compression according to an embodiment of the application. FIG. 6A shows an original weight mapping, in which weights of four filters are mapped to the cells in the columns of a crossbar array 60, respectively. That is, weights ($w_{1,1}$, $w_{1,2}$, $w_{1,3}$, $w_{1,4}$, $w_{1,5}$, $w_{1,6}$, $w_{1,7}$, $w_{1,8}$) of a first filter are mapped to the cells in a first column of the crossbar array 50, weights ($w_{2,1}$, $w_{2,2}$, $w_{2,3}$, $w_{2,4}$, $w_{2,5}$, $w_{2,6}$, $w_{2,7}$, $w_{2,8}$) of a second filter are mapped to the cells in a second column of the crossbar array 60, and so on. An OU 62 with a size of 2×2 is applied to perform OU computation. Accordingly, inputs $i_1$ to $i_8$ are inputted to the input lines of the crossbar array 60 through the DAC 64 using multiple clock cycles. That is, inputs $i_1$ and $i_2$ are inputted to the cells in the OU 62 in a first cycle, and then inputs $i_3$ and $i_4$ are inputted to the cells in the OU next to the OU 62 in a second cycle, and so on.

It is noted that cells denoted with shadows represent the cells mapped with a weight of 0. Referring to FIG. 6B, the rows of the cells of each OU are compressed by removing the rows of cells mapped with the weight of 0, and the inputs to be inputted for the rows of cells being removed are also removed from the input cycles. For example, the cells mapped with weights $w_{1,3}$ and $w_{2,3}$ in the third row of the crossbar array 60 are removed and the input $i_3$ to be inputted to the removed cells is removed from the input cycles, the cells mapped with weights $w_{1,7}$ and $w_{2,7}$ in the seventh row of the crossbar array 60 are removed and the input $i_7$ to be inputted to the removed cells is removed from the input cycles, and so on.

As a result, referring to FIG. 6C, the rows of the cells of each OU in a crossbar array 60a are compressed and a computation order of the inputs to be inputted to the compressed rows of the cells is rearranged according to a number of rows (i.e. 2 in the present embodiment) of each OU. For example, the inputs $i_1$ and $i_2$ are rearranged to be inputted to the cells mapped with weights $w_{1,1}$, $w_{1,2}$, $w_{2,1}$ and $w_{2,2}$ of the OU 62a in cycle 1, the inputs $i_4$ and $i_5$ are rearranged to be inputted to the cells mapped with weights $w_{1,4}$, $w_{1,5}$, $w_{2,4}$ and $w_{2,5}$ of the OU next to the OU 62a in cycle 2, and so on.

It is noted that in response to weight compression as described above, an indexing procedure such as run-length indexing is perform to record the positions of the rows of cells not being removed such that the computation apparatus can fetch the inputs corresponding to the rows of each OU excluding the rows of the cells with the weight of 0.

Figure 7:
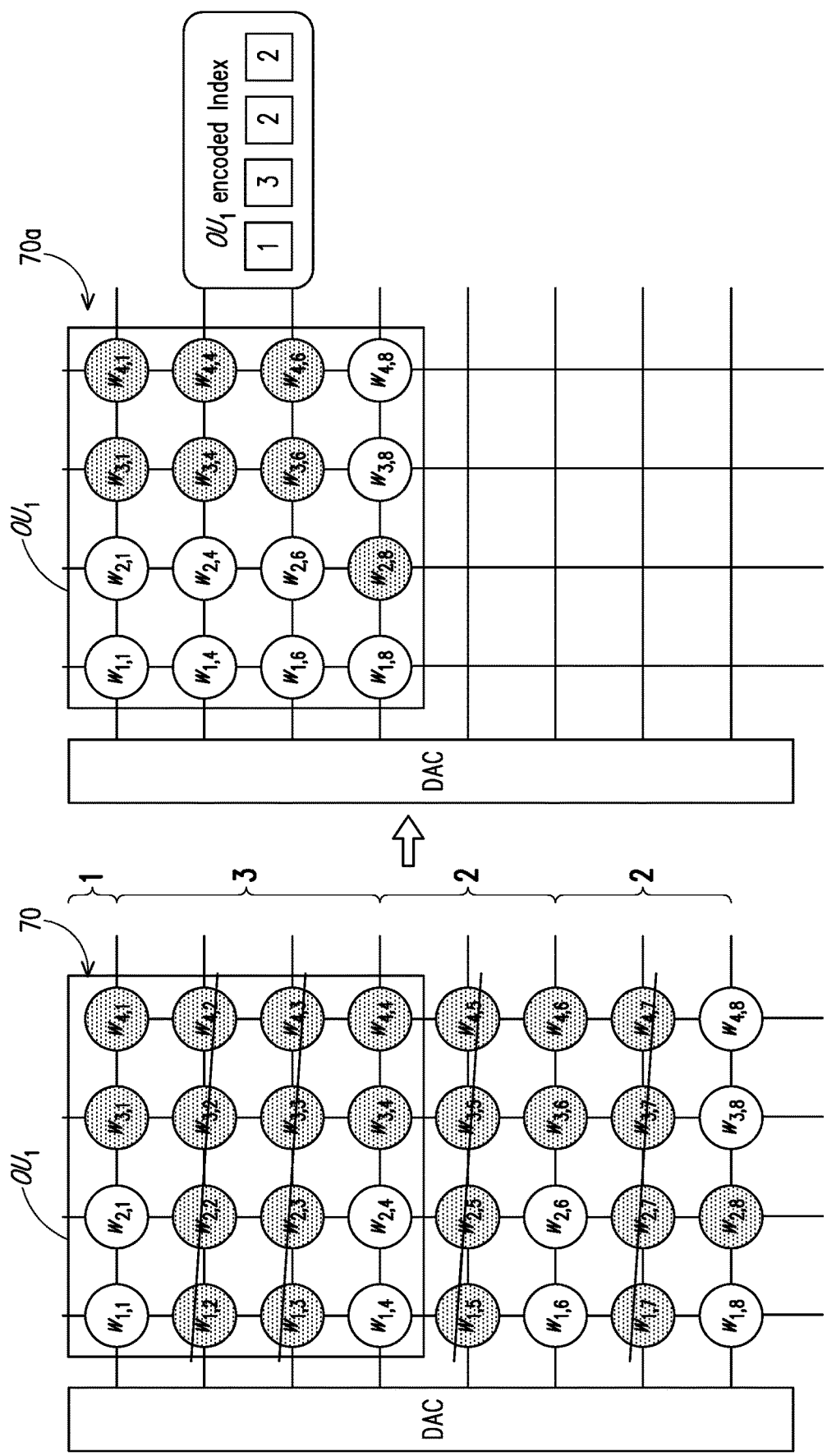
FIG. 7 is a schematic diagram illustrating indexing for weight compression according to an embodiment of the application.

For example, FIG. 7 is a schematic diagram illustrating indexing for weight compression according to an embodiment of the application. Referring to a crossbar array 70 in FIG. 7, an OU (e.g. $OU_1$) with a size of 4×4 is applied to perform OU computation. According to the weight compression described in the embodiment of FIG. 6A to FIG. 6C, the cells denoted with shadows represent the cells mapped with a weight of 0 and are removed to save the computation cost. For example, the cells mapped with weights $w_{1,2}$, $w_{2,2}$, $w_{3,2}$ and $w_{4,2}$ in the second row of the crossbar array 70 are removed, the cells mapped with weights $w_{1,3}$, $w_{2,3}$, $w_{3,3}$ and $w_{4,3}$ in the third row of the crossbar array 70 are removed, and so on. The crossbar array 70a in FIG. 7 shows the rows of cells after weight compression.

It is noted that, in the present embodiment, a run length indexing is performed to record the positions of the rows of cells left after weight compression. Referring to the crossbar array 70, the first row, the fourth row, the sixth row and the eighth row are left after weight compression, and accordingly the values 1, 3, 2, 2 respectively indicate a distance between the first row to an origin row (i.e. an imaginary 0th row), a distance between the first row and the fourth row, a distance between the fourth row and the sixth row, and a distance between the sixth row and the eighth row are encoded to generate an encoded index (1, 3, 2, 2).

In summary, in the computation method and the computation apparatus exploiting weight sparsity provided in the embodiments of the present disclosure, weight sparsity is exploited to compress the weights for OU computations with only minimal indexing overhead. Accordingly, OU computations with zero weights are skipped and the performance and energy efficiency of the ReRAM-based DNN accelerator can be enhanced.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A computation method exploiting weight sparsity, adapted for a processor to perform multiply-and-accumulate (MAC) operations on a memory having a crossbar architecture, wherein the memory comprises a plurality of input lines and a plurality of output lines crossing each other, a plurality of cells respectively disposed at intersections of the input lines and the output lines, and a plurality of sense amplifiers respectively connected to the output lines, the method comprising:

mapping a plurality of weights to the cells of each of a plurality of operation units (OUs) in the memory;

compressing the rows of the cells of each OU by removing at least one row of the cells each mapped with a weight of 0, and encoding an index including values each indicating a distance between every two rows of the cells including at least one cell mapped with a non-zero weight for each OU; and inputting a plurality of inputs to the input lines corresponding to the rows of each OU excluding the rows of the cells with the weight of 0 according to the index and sensing a plurality of multiply-and-accumulate results from the output lines by the sense amplifiers corresponding to the OU to compute a computation result.

2. The method of claim 1, wherein the step of inputting a plurality of inputs to the input lines corresponding to the rows of each OU excluding the rows of the cells with the weight of 0 according to the index comprises:

decoding the index to obtain the values indicating the distances; and fetching the inputs to be inputted to the rows of the cells separated by the values and inputting the inputs into the corresponding input lines.

3. The method of claim 2, wherein the step of inputting the inputs into the corresponding input lines comprises:

checking values of the inputs to be inputted; and skipping the inputs with a value of 0 and inputting the inputs other than the skipped inputs into the corresponding input lines.

4. The method of claim 2, wherein the step of inputting the inputs into the corresponding input lines comprises:

rearranging a computation order of the inputs according to a number of rows of each OU.

5. The method of claim 1, wherein each OU comprises the cells disposed at intersections of at least two of the input lines and at least two of the output lines, and the corresponding sense amplifiers connected to the output lines.

6. The method of claim 1, wherein the memory further comprises a digital-to-analog converter (DAC) to convert an input data into a plurality of input voltages serving as the inputs.

7. The method of claim 1, wherein the step of sensing a plurality of multiply-and-accumulate results from the output lines by the sense amplifiers corresponding to the OU to compute a computation result comprises:

sensing the multiply-and-accumulate results, weighting the sensed multiply-and-accumulate results with corresponding exponential bases and then summing weighted results to obtain the computation results.

8. The method of claim 1, wherein the memory comprises NAND flash, NOR flash, phase change memory (PCM), spin-transfer torque random-access memory (STT-RAM), resistive random-access memory (ReRAM), magnetoresistive random-access memory (MRAM), ferroelectric random-access memory (FRAM), static random-access memory (SRAM), or dynamic random-access memory (DRAM).

9. The method of claim 1, wherein the input lines are wordlines of the memory and the output lines are bitlines of the memory, or the input lines are bitlines of the memory and the output lines are wordlines of the memory.

10. A computation apparatus exploiting weight sparsity, comprising:
a memory having a crossbar architecture, comprising:
a plurality of input lines and a plurality of output lines crossing each other;
a plurality of cells respectively disposed at intersections of the input lines and the output lines; and
a plurality of sense amplifiers respectively connected to the output lines; and
a processor, coupled to the memory and configured to perform MAC operations comprising steps of:
mapping a plurality of weights to the cells of each of a plurality of operation units (OUs) in the memory;
compressing the rows of the cells of each OU by removing at least one row of the cells each mapped with a weight of 0, and encoding an index including values each indicating a distance between every two rows of the cells including at least one cell mapped with a non-zero weight for each OU; and
inputting a plurality of inputs to the input lines corresponding to the rows of each OU excluding the rows of the cells with the weight of 0 according to the index and sensing a plurality of multiply-and-accumulate results from the output lines by the sense amplifiers corresponding to the OU to compute a computation result.

11. The computation apparatus of claim 10, wherein the processor decodes the index to obtain the values indicating the distances, fetches the inputs to be inputted to the rows of the cells separated by the values and inputs the inputs into the corresponding input lines.

12. The computation apparatus of claim 11, wherein the processor checks values of the inputs to be inputted, skips the inputs with a value of 0, and inputs the inputs other than the skipped inputs into the corresponding input lines.

13. The computation apparatus of claim 11, wherein the processor rearranges a computation order of the inputs according to a number of rows of each OU.

14. The computation apparatus of claim 10, wherein each OU comprises the cells disposed at intersections of at least two of the input lines and at least two of the output lines, and the corresponding sense amplifiers connected to the output lines.

15. The computation apparatus of claim 10, wherein the memory further comprises a digital-to-analog converter (DAC) to convert an input data into a plurality of input voltages serving as the inputs.

16. The computation apparatus of claim 10, wherein the processor senses the multiply-and-accumulate results, weights the sensed multiply-and-accumulate results with corresponding exponential bases and then sums weighted results to obtain the computation results.

17. The computation apparatus of claim 10, wherein the memory comprises NAND flash, NOR flash, PCM, STT-RAM, ReRAM, MRAM, FRAM, SRAM, or DRAM.

18. The computation apparatus of claim 10, wherein the input lines are wordlines of the memory and the output lines are bitlines of the memory, or the input lines are bitlines of the memory and the output lines are wordlines of the memory.

* * * * *